United States Patent
Djurdjevic et al.

(10) Patent No.: US 8,037,393 B2
(45) Date of Patent: *Oct. 11, 2011

(54) TECHNIQUES FOR GENERATING BIT RELIABILITY INFORMATION IN THE POST PROCESSOR

(75) Inventors: Ivana Djurdjevic, San Jose, CA (US); Richard Leo Galbraith, Rochester, MN (US); Bruce Alexander Wilson, San Jose, CA (US); Yuan Xing Lee, San Jose, CA (US); Travis Roger Oenning, Rochester, MN (US); Mario Blaum, San Jose, CA (US); Ksenija Lakovic, Menlo Park, CA (US); Zongwang Li, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 1138 days.

This patent is subject to a terminal disclaimer.

(21) Appl. No.: 11/771,226

(22) Filed: Jun. 29, 2007

(65) Prior Publication Data

US 2009/0006930 A1    Jan. 1, 2009

(51) Int. Cl.
*H03M 13/45* (2006.01)
(52) U.S. Cl. .................................................... 714/780
(58) Field of Classification Search .............. 714/769, 714/780, 795, 760
See application file for complete search history.

(56) References Cited

U.S. PATENT DOCUMENTS

| | | | |
|---|---|---|---|
| 5,521,945 A * | 5/1996 | Knudson | 375/341 |
| 5,949,831 A | 9/1999 | Coker et al. | |
| 6,377,635 B1 | 4/2002 | Cideciyan et al. | |
| 6,460,150 B1 * | 10/2002 | Cideciyan et al. | 714/709 |
| 6,513,141 B1 * | 1/2003 | Livingston | 714/792 |
| 6,522,705 B1 * | 2/2003 | Conway et al. | 375/341 |
| 6,581,181 B1 * | 6/2003 | Sonu | 714/795 |
| 6,691,263 B2 | 2/2004 | Vasic et al. | |
| 6,694,477 B1 * | 2/2004 | Lee | 714/784 |
| 6,708,308 B2 | 3/2004 | De Souza et al. | |
| 6,823,487 B1 * | 11/2004 | Poeppelman | 714/785 |
| 6,986,098 B2 * | 1/2006 | Poeppelman et al. | 714/807 |
| 7,012,974 B1 * | 3/2006 | Liu et al. | 375/340 |
| 7,099,411 B1 | 8/2006 | Wu et al. | |
| 7,725,800 B2 * | 5/2010 | Yang et al. | 714/755 |
| 7,805,664 B1 * | 9/2010 | Yang et al. | 714/794 |

* cited by examiner

*Primary Examiner* — Stephen Baker
(74) *Attorney, Agent, or Firm* — Steven J. Cahill (57) ABSTRACT

A detector generates a detected sequence, and a post processor generates probability values that indicate the likelihood of a plurality of error events in the detected sequence. The post processor partitions the values into first and second subsets. The post processor selects a first most likely value from the first subset of the values and a second most likely value from the second subset of the values. The post processor generates a bit reliability based on the first and the second most likely values.

20 Claims, 4 Drawing Sheets

TECHNIQUES FOR GENERATING BIT RELIABILITY INFORMATION IN THE POST PROCESSOR

BACKGROUND OF THE INVENTION

The present invention relates to techniques for correcting errors, and more particularly to techniques for generating bit reliability information in the post processor.

When a data sequence is read from a magnetic hard disk using a hard disk drive, the data sequence can be estimated by running the signal samples at the output of the channel through a Viterbi detector. A Viterbi detector uses the principles of dynamic programming to find the most likely data sequence given a sequence of noisy observations of the channel.

Errors in the Viterbi detector output are most commonly isolated bits. However, the physical properties of the magnetic recording system make short bursts of errors reasonably common. These error events are sometimes described using "+", "−" and "0" characters. A "+" character represents a recorded binary zero detected as a one. A "−" character represents a recorded binary one detected as a zero. A "0" character represents a bit that is detected correctly. Thus, a +−+ error event might occur if a recorded pattern 001011 were detected as 010111, and a −0− error event might occur if 011101 were detected as 001001.

The Viterbi detected sequence can be improved (i.e., the number of errors in it can be reduced) by incorporating linear block code parity constraints and/or more accurate (longer) target response. However, these improvements come with exponential increase in the complexity of the Viterbi detector. Instead of incorporating linear block code parity constraints and/or better (longer) target response into the Viterbi detector itself, it is frequently more efficient to construct a separate parity post processor that acts on the output of a Viterbi detector. A parity post processor (PPP) is a signal processing module. A parity post processor can, for example, be used with a Viterbi detector to enforce a parity code constraint and/or to re-compute more accurate metric values than the one used by the Viterbi detector.

However, many error correction systems that contain a Viterbi detector and a parity post processor do not provide a sufficient amount of protection against error events, and in particular do not provide high quality bit reliability information. Therefore, it would be desirable to provide an error correction system that can provide more robust techniques for correcting errors in data sequences and high quality bit reliability information.

BRIEF SUMMARY OF THE INVENTION

According to embodiments of the present invention, a detector generates a detected data sequence, and a post processor generates probability values that indicate the likelihood of a plurality of error events in the detected sequence. The post processor partitions the values into first and second subsets. The post processor selects a first most likely value from the first subset of the values and a second most likely value from the second subset of the values. The post processor generates a bit reliability based on the first and the second most likely values.

Other objects, features, and advantages of the present invention will become apparent upon consideration of the following detailed description and the accompanying drawings.

DETAILED DESCRIPTION OF THE INVENTION

Iterative decoders are able to effectively decode codes involving a large number of parity checks by dividing the parity checks into subsets and applying these subsets independently. Because only a subset of all parity checks are considered at any time, an iterative decoder does not necessarily decode directly to a codeword that satisfies all parity checks. Instead, it reinforces bits that are consistent with the parity checks considered and marks as unreliable bits that are inconsistent with these parity checks. On a subsequent iteration, bits that have been flagged as unreliable many times are eventually flipped.

In order to apply iterative decoding to a magnetic recording channel, a detector is used to decode a noisy read-back signal to binary data with an associated reliability value. It is also desirable to allow the detector to take a prior estimate of each bit value and reliability. The prior estimates allow the detector to refine its estimate each time the system iterates. A detector of this type is referred to as a soft-in/soft-out detector, or simply a SISO detector. A modification of the Viterbi algorithm that can provide a soft output is referred to as the soft-output Viterbi algorithm or SOVA.

Soft information is often represented as a log-likelihood ratio (LLR). The soft information of a bit b is commonly represented by a log-likelihood ratio (LLR) shown in equation (1).

$$LLR(b) = \log\left\{\frac{Pr(b=1)}{Pr(b=0)}\right\} \quad (1)$$

In equation (1), Pr(b=1) represents the probability that bit b is 1, and Pr(b=0) represents the probability that bit b is 0. The sign of a LLR represents the most likely bit value. A positive LLR (LLR>0) means that a binary 1 is more likely, and a negative LLR (LLR<0) means that a binary 0 is more likely. The magnitude (i.e., absolute value) of the LLR represents the reliability. A larger magnitude LLR means a more reliable decision, and a smaller magnitude LLR means a less reliable decision.

Figure 1:
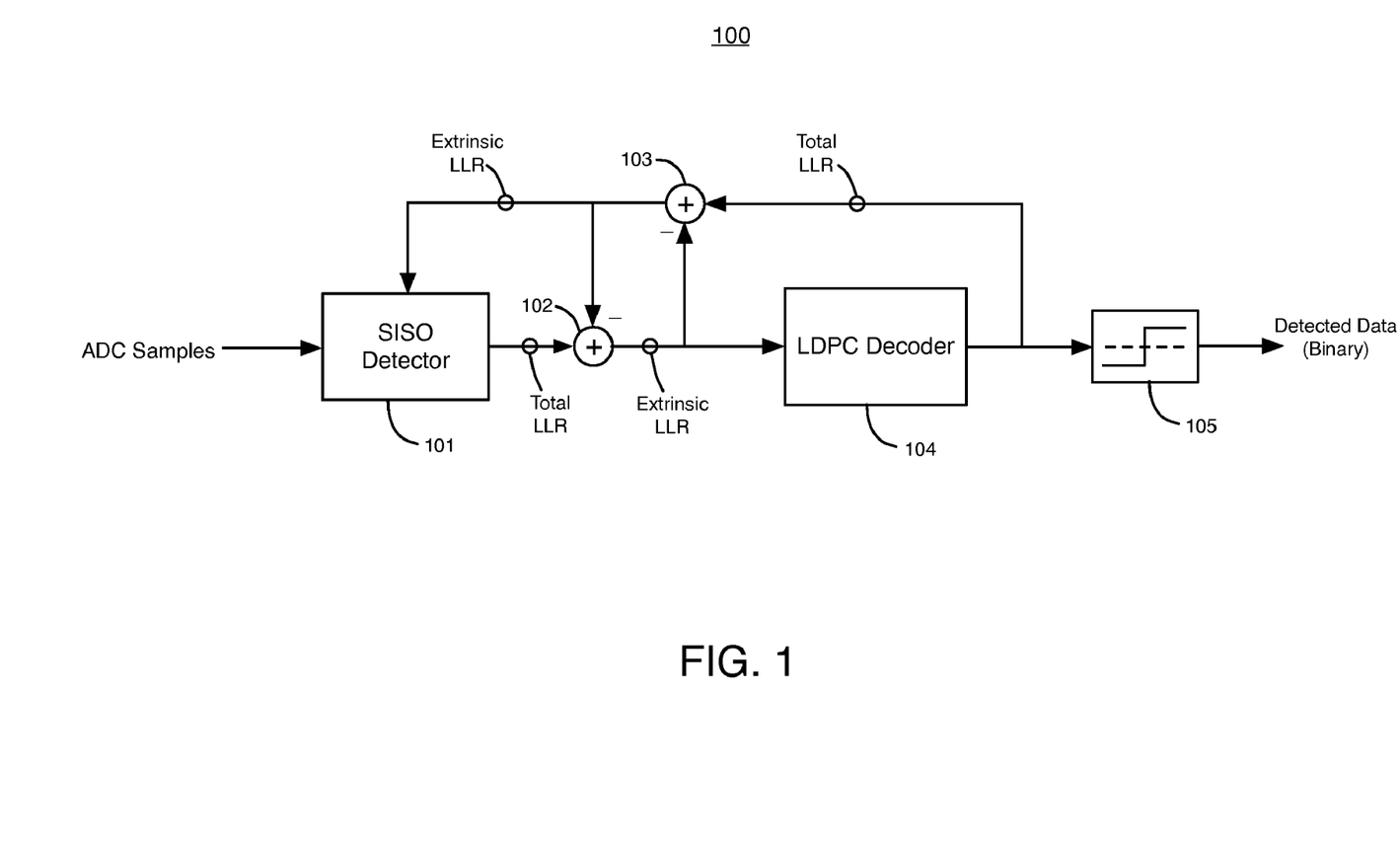
FIG. 1 illustrates an iterative decoder in which soft information is exchanged between a soft-input-soft-output (SISO) detector and a low density parity check code (LDPC) decoder, according to an embodiment of the present invention.

FIG. 1 illustrates an iterative decoder 100 in which soft information is exchanged between a soft-input-soft-output (SISO) detector 101 that analyzes the inter-symbol interference and a low density parity check code (LDPC) decoder 104, according to an embodiment of the present invention.

Soft-input-soft-output (SISO) detector 101 receives digitized read-back samples (ADC samples) and an estimate of the bit probability values from adder 103 (extrinsic LLR). This extrinsic LLR is initially zero, indicating 1 and 0 are equally likely.

SISO detector 101 computes the probability that each bit in the sequence is a 1 (total LLR) consistent with the input read-back signal and the extrinsic LLR information presented to it by adder 103. The influence of the input LLR information is subtracted from the total LLR at adder 102 to yield the extrinsic LLR, which is an input to LDPC decoder 104.

In a similar fashion LDPC decoder 104 computes the probability that each bit in the sequence is a 1 (total LLR) consistent with the constraints of a low density parity check (LDPC) code and LLR information presented to it from SISO detector 101. The influence of the input LLR information is subtracted from the total at adder 103 to yield the extrinsic LLR, which is input to SISO detector 101. This procedure repeats until a prescribed stopping criterion is reached. When the stopping criteria is reached, the sign of each total LLR value is taken as the value for the corresponding data bit.

Although SISO detector 101 is shown with a LDPC decoder in FIG. 1, SISO detector 101 can be used in conjunction with any kind of soft decoder (e.g., turbo, LDPC, soft Reed-Solomon, etc).

Figure 2:
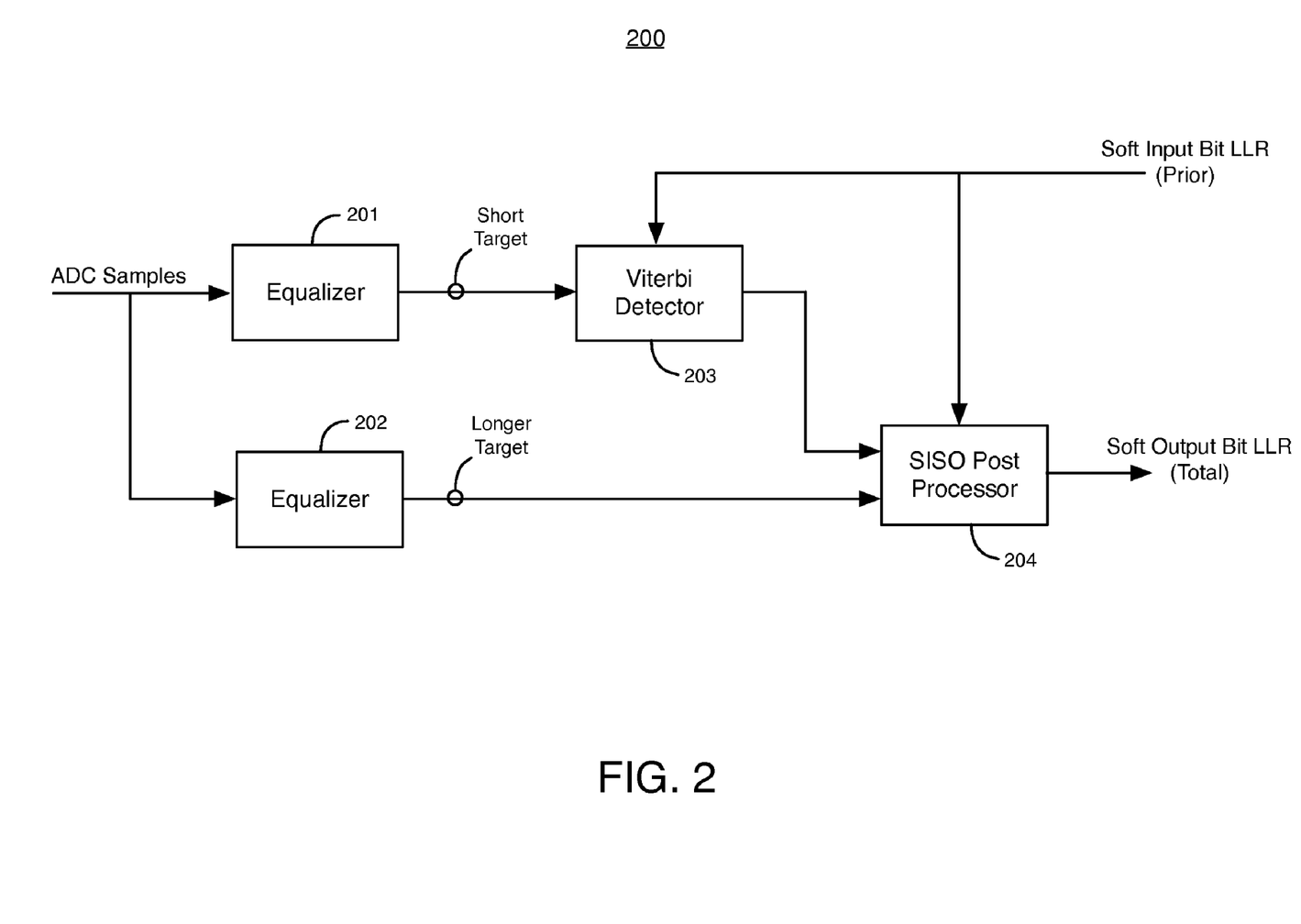
FIG. 2 illustrates a block diagram of a soft-input-soft-output (SISO) detector, according to an embodiment of the present invention.

FIG. 2 illustrates a block diagram of a SISO detector 200, according to an embodiment of the present invention. SISO detector 200 is an example of SISO detector 101 shown in FIG. 1.

In SISO detector 200, a finite impulse response (FIR) equalizer 201 receives digitized read-back samples (ADC samples) and reshapes the readback signal into a short target response at its output as required by Viterbi detector 203. Viterbi detector 203 receives the equalized signal from equalizer 201 as an input signal.

Viterbi detector 203 can also receive an estimate of the bit probability values (soft input bit LLR) from adder 103. Viterbi detector 203 then outputs the most likely binary data sequence based on the input signals. Alternatively, Viterbi detector 203 can output the most likely binary data sequence based on only the equalized signal from equalizer 201. According to other alternative embodiments, Viterbi detector 203 can be replaced with another type of sequence detector.

A second FIR equalizer 202 receives the digitized readback samples (ADC samples) and reshapes the readback signal to a longer target response at its output. The longer target response generated by equalizer 202 is able to more faithfully represent the behavior of the recording system than the short target response required by Viterbi detector 203. The equalized signal from equalizer 202 is transmitted to an input of a soft-input-soft-output (SISO) post processor 204. SISO post processor 204 receives the equalized signal from equalizer 202 at an input. The equalized output signal of equalizer 202 is delayed by a delay block (not shown) to compensate for the delay of Viterbi detector 203 so that the output signal of equalizer 202 corresponds to the bits output by Viterbi detector 203.

SISO post processor 204 also receives the binary data sequence generated by Viterbi detector 203 at a second input. SISO post processor 204 can also receive an estimate of the bit probability values (soft input bit LLR) from adder 103 at a third input. SISO post processor 204 outputs the conditional probability that each data bit is a binary 1, based on the readback signals from blocks 202-203 and the prior bit probability. The probability output by post processor 204 can, for example, be expressed as a log likelihood ratio (LLR). Alternatively, SISO post processor 204 can output the conditional probability that each data bit is a binary 1, based only on the readback signals from equalizer 202 and Viterbi detector 203.

Figure 3A:
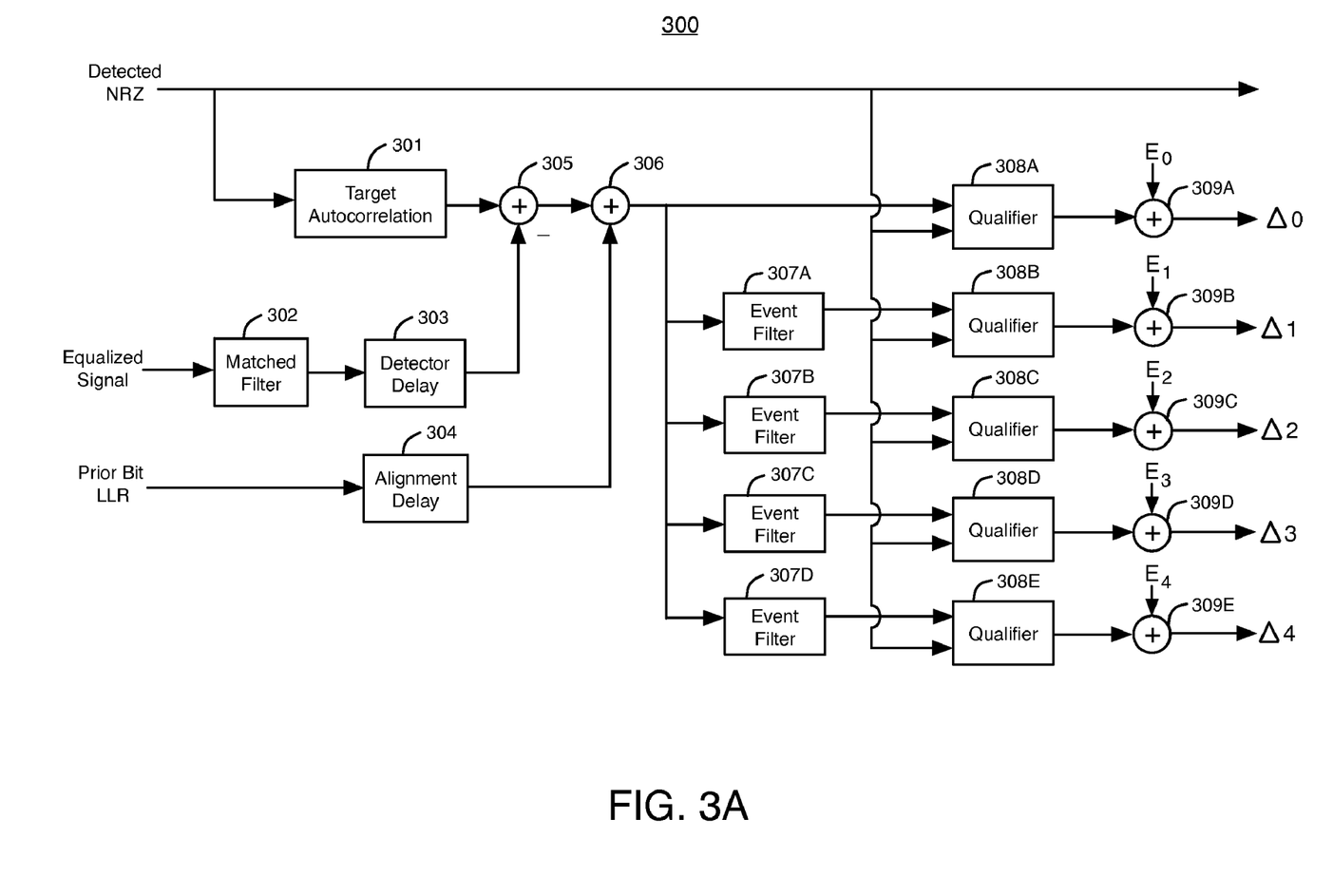
FIGS. 3A-3B illustrate an example of a soft-input-soft-output (SISO) post processor, according to another embodiment of the present invention.
Figure 3B:
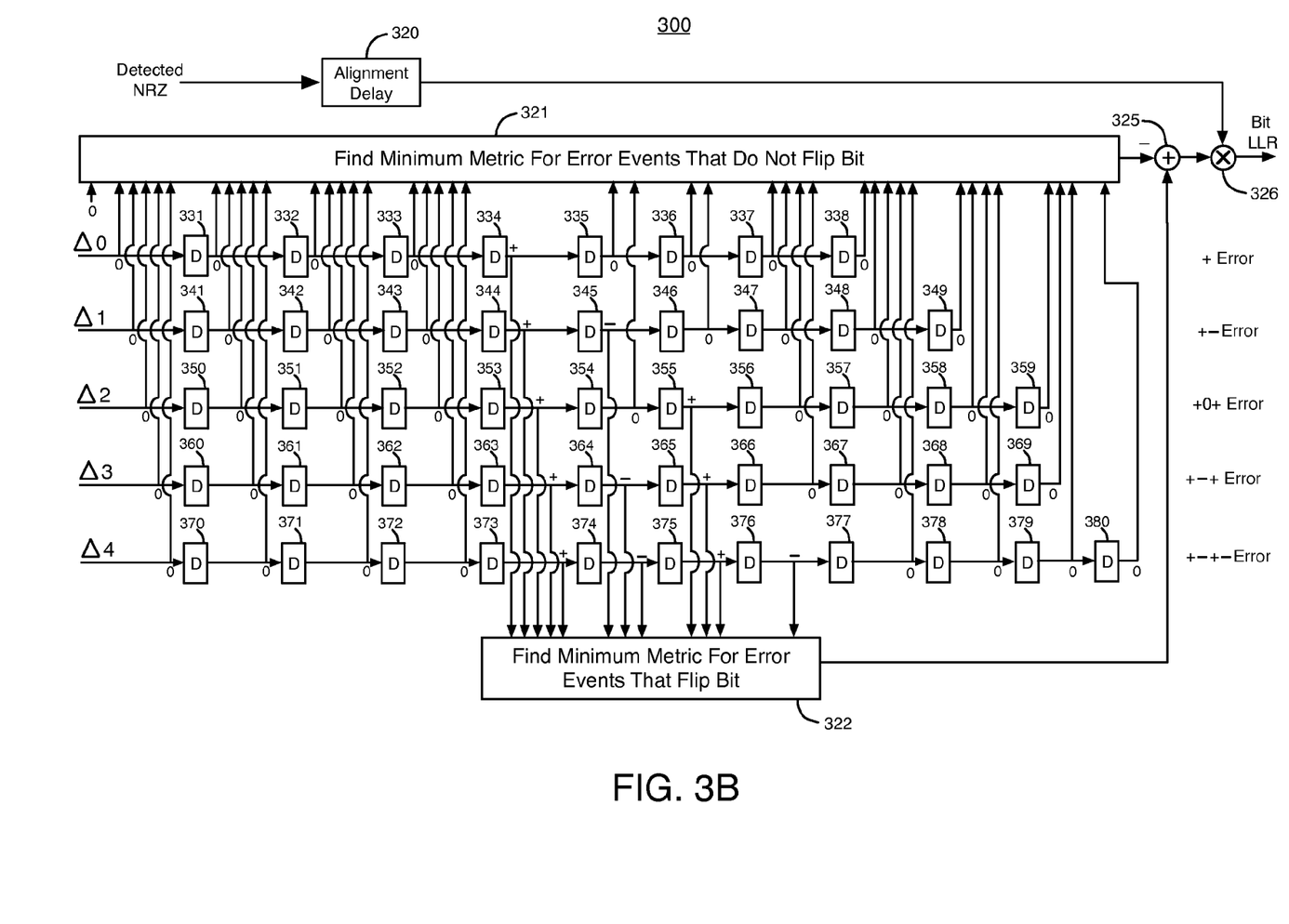

FIGS. 3A-3B illustrate an example of a soft-input-soft-output (SISO) post processor 300, according to another embodiment of the present invention. SISO post processor 300 is an example of SISO post processor 204 shown in FIG. 2.

A first portion of SISO post processor 300 is shown in FIG. 3A, and a second portion of SISO post processor 300 is shown in FIG. 3B. The two portions of SISO post processor 300 shown in FIGS. 3A and 3B are connected together at the terminals that contain the detected NRZ (non-return-to-zero) signal and the $\Delta 0$-$\Delta 4$ output signals.

SISO post processor 300 receives the equalized signal and applies a filter matched to the post processor target at matched filter block 302. The resulting matched filtered value output by block 302 is delayed by detector delay block 303 to accommodate the latency of Viterbi detector 203.

Viterbi detector 203 outputs a data sequence that can be represented in any desired format. In the example of FIGS. 3A-3B, detector 203 generates an output sequence in a standard NRZ (non-return-to-zero) format. SISO post processor 300 receives the detected NRZ data from Viterbi detector 203 and convolves this detected NRZ data sequence with the autocorrelation of the post processor target using block 301 to obtain the output of the matched filter that would be expected in the absence of noise or errors.

Adder 305 subtracts the output value of target autocorrelation block 301 from the delayed matched filter (that is output by block 303) to obtain an estimate of the matched-filtered noise sequence. SISO post processor 300 optionally accepts an estimate of the prior bit probability (LLR) values from adder 103. The prior bit LLR values are delayed by alignment delay block 304 and then combined with the matched filtered error signal at adder 306.

The difference metric $\Delta 0$ of a single bit error is computed by optionally flipping the sign of the modified matched filtered noise signal in qualifier 308A according to the value of the corresponding detected data bit and adding it to the error event energy term E0. Thus, the output signal of adder 306 is added to the error event energy term E0 at adder 309A to generate a difference metric. Other error event energy terms are indicated by E1-E4 in FIG. 3A.

Event filters 307A-307D store a set of multi-bit error events. However, multi-bit error events are not always possible. Therefore, each multi-bit error event is qualified by checking that the detected data sequence is consistent with each multi-bit error event using qualifiers 308B-308E. For any unqualified error event, a predefined value that indicates the error event is not qualified is assigned to the difference metric of the unqualified error event.

The difference metrics of multi-bit error events are computed by combining the modified matched filtered noise values for all of the bits affected by the error event at event filters 307A-307D, optionally flipping the sign according to the values of the corresponding detected data bits using qualifiers 308B-308E, and adding the result to the appropriate error event energy term E1-E4 at adders 309B-309E. Each of the output signals $\Delta 0$-$\Delta 4$ of adders 309A-309E represents a difference metric.

SISO post processor 300 computes the reliability of each bit in the input data sequence. Every sequence of bits is given a metric. A good measure of the reliability for each bit in the input data sequence is the difference in the metric in two most likely sequences that differ at that particular bit position. Each error event starting at a particular bit location has assigned to it a difference metric. The difference metric for each error event is calculated as the difference between the metric assigned to the detected NRZ sequence by Viterbi 203 and a metric assigned to a sequence that differs from the detected NRZ sequence by a particular error event starting at a particular bit location.

Alternatively, each of the output signals $\Delta 0$-$\Delta 4$ of adders 309A-309E can represent the log of a ratio of the likelihood that the recorded bit pattern differs from the detected NRZ sequence by a specific error pattern and the likelihood that it does not differ from the detected NRZ sequence. SISO post processor 300 maps reliability measures of complex error events to reliability measures of individual bits. Each of the reliability measures can be expressed either as a formal LLR or as a difference metric that can differ from a formal LLR up to a multiplicative constant. For simplicity, the output signals Δ0-Δ4 of adders 309A-309E are referred to herein as the difference metrics.

The output signal Δ0 of adder 309A represents the difference metric of a single bit error event. The output signals Δ1-Δ4 of adders 309A-309E represent the difference metrics of 4 multi-bit error events. These error events can, for example, represent all error events that could have affected the current bit.

In the example of FIGS. 3A-3B, qualifier 308A and adder 309A compute the difference metric Δ0 for a + error event in the output of Viterbi detector 203. Event filter 307A, qualifier 308B, and adder 309B compute the difference metric Δ1 for a +− error event in the output of Viterbi detector 203. Event filter 307B, qualifier 308C, and adder 309C compute the difference metric Δ2 for a +0+ error event in the output of Viterbi detector 203. Event filter 307C, qualifier 308D, and adder 309D compute the difference metric Δ3 for a +−+ error event in the output of Viterbi detector 203. Event filter 307D, qualifier 308E, and adder 309E compute the difference metric Δ4 for a +−+− error event in the output of Viterbi detector 203.

SISO post processor 300 stores the difference metrics Δ0-Δ4 for multiple errors in a FIFO buffer that includes a set of latches 331-338 and 341-380 shown in FIG. 3B. Each of the latches 331-338 and 341-380 functions as a delay circuit that stores the difference metrics for each error event. Latches 331-338 and 341-380 can, for example, be controlled by a clock signal (not shown).

The difference metrics Δ0-Δ4 from adders 309A-309E are transmitted to and initially stored in latches 331, 341, 350, 360, and 370, respectively, as shown in FIG. 3B. Each column of latches in FIG. 3B stores the difference metrics for a bit at a particular bit location (i.e., a bit received during a particular time interval).

For example, the difference metrics for the current bit location are stored in latches 334, 344, 353, 363, and 373. The bit log-likelihood ratio (LLR) generated at the output of SISO post processor 300 corresponds to the current bit location represented by latches 334, 344, 353, 363, and 373. As another example, latches 333, 343, 352, 362, and 372 store difference metrics that correspond to the subsequent bit location. As yet another example, latches 335, 345, 354, 364, and 374 store difference metrics for the previous bit location.

The difference metric Δ0 for a + error event is serially shifted through latches 331-338. The difference metric Δ1 for a +− error event is serially shifted through latches 341-349. The difference metric Δ2 for a +0+ error event is serially shifted through latches 350-359. The difference metric Δ3 for a +−+ error event is serially shifted through latches 360-369. The difference metric Δ4 for a +−+− error event is serially shifted through latches 370-380.

The configuration of SISO post processor 300 in FIGS. 3A-3B is shown merely as an example of the present invention. For example, the number of event filters and qualifiers can be greater than or less than the number shown in FIG. 3A, depending on the number of error events that are analyzed. Also, the number of latches in SISO post processor 300 can be greater than or less than the number of latches shown in FIG. 3B, depending on the number and type of error events that are analyzed.

In FIG. 3B, SISO post processor 300 computes a tentative reliability measure as the difference of two quantities. The first quantity (Q1) is the minimum difference metric among all error events that would flip that bit (i.e., the lower find minimum). The second quantity (Q2) is the minimum difference metric among all error events that would not flip that bit (i.e., the upper find minimum). Thus, the tentative reliability equals Q1-Q2.

SISO post processor 300 uses the difference metric value of multiple error events to compute the reliability of multiple bits. A multi-bit error starting in one of several locations could affect (flip or not flip) the same bit. Additionally, several types of errors are considered in computing the reliability of neighboring bits that would be affected (flipped or not flipped) by these error events.

The difference metric outputs of adders 309A-309E and the difference metric outputs of latches 331-338 and 341-380 are transmitted to either block 321 or to block 322. In the example of FIGS. 3A-3B, block 322 in SISO post processor 300 analyzes a set of 12 error events that flip the current bit.

SISO post processor 300 generates a bit LLR at the output of multiplier 326. The bit LLR is the log-likelihood ratio (LLR) for the bit location that is represented by the values stored in latches 334, 344, 353, 363, and 373. Thus, with respect to the output value of the bit LLR, latches 334, 344, 353, 363, and 373 represent the current bit location.

In computing the reliability of the current bit, block 322 receives a difference metric for a single + bit error starting in the current bit location from latch 334. Block 332 also receives difference metrics for a +− error event starting in the current bit location and the previous bit location from latches 344-345. Block 322 also receives difference metrics for a +0+ error event starting in the current bit location and a bit location that is two bit locations earlier from latches 353 and 355. Block 322 also receives difference metrics for a +−+ error event starting in the current bit location and in the two previous bit locations from latches 363-365. Block 322 also receives difference metrics for a +−+− error event starting in the current bit location and in the three previous bit locations from latches 373-376. After analyzing all 12 of these error events that flip the current bit, block 322 selects the error event having the minimum difference metric.

In computing the reliability of the current bit, block 321 receives the difference metrics for the null error event, which has a value of 0 by definition. Block 321 also receives difference metrics for a single + bit error in the 4 previous bit locations and in the 4 subsequent bit locations from adder 309A and latches 331-333 and 335-338. Block 321 also receives difference metrics for a +− error event in the 4 previous bit locations and in the second, third, fourth, and fifth subsequent bit locations from adder 309B and latches 341-343 and 346-349. Block 321 also receives difference metrics for a +0+ error event in the 4 previous bit locations and in the first, third, fourth, fifth, and sixth subsequent bit locations from adder 309C and latches 350-352, 354, and 356-359. Block 321 also receives difference metrics for a +−+ error event in the 4 previous bit locations and in the third, fourth, fifth, and sixth subsequent bit locations from adder 309D and latches 360-362 and 366-369. Block 321 also receives difference metrics for a +−+− error event in the 4 previous bit locations and in the fourth, fifth, sixth, and seventh subsequent bit locations from adder 309E and latches 370-372 and 377-380. In all, block 321 analyzes 42 possible error events that do not flip the current bit, including the null error event.

The minimum difference metric corresponds to the most likely error event at a particular bit location. Thus, block 322 determines the most likely error event that flips the current bit, and block 321 determines the most likely error event that does not flip the current bit. The most likely error event corresponds to a negative metric when the error event is more likely than the output of the Viterbi detector.

According to an alternative embodiment, SISO post processor 300 can be configured such that the maximum metric corresponds to the most likely error event at a particular bit location. In this embodiment, block 322 computes the maximum metric for an error event that flips the current bit, and block 321 computes the maximum metric for an error event that does not flip the current bit.

According to another alternative embodiment, blocks 321 and 322 can perform a more complex operation using the following logarithmic equation: log(exp(input1)+exp(input2)+exp(input3)+ . . . +exp(inputN)), where the 1-N inputs refer to N input difference metrics.

According to another embodiment, block 321 in SISO post processor 300 can analyze all the error events that do not flip the current bit, but that flip one or more bits before the current bit. Block 321 can also analyze all the error events that do not flip the current bit, but that flip one or more bits after the current bit. Block 321 can also analyze the error events that do no flip the current bit, but that flip bits before and after the current bit as shown in FIG. 3B.

In each predefined interval of time, SISO post processor 300 computes a tentative reliability measure for a selected set of error events that end at a particular bit location using adder 325. Specifically, the tentative reliability measure is computed as the difference of the two minima metrics selected by blocks 321 and 322 using adder 325. Adder 325 subtracts the minimum difference metric selected by block 322 among all error events that flip the current bit from the minimum difference metric selected by block 321 among all error events that do not flip the current bit.

Then, the selected set of errors events are applied directly to the current bit at multiplier 326. Some of the selected error events can be applied to one, two, three, or more of the previous and future bits, depending on the error event. The difference of the two minima is translated to a bit LLR value by multiplying at multiplier 326 the tentative reliability measure from adder 325 by the corresponding Viterbi detector output bit value (e.g., expressed as +1 or −1) from alignment delay block 320. The magnitude (or absolute value) of the bit LLR output value of multiplier 326 represents the bit reliability. Alignment delay block 320 delays the detected NRZ signal to compensate for the delay of SISO post processor 300.

Techniques of the present invention, including the blocks shown in FIGS. 1, 2, and 3A-3B, can be implemented in hardware, in software, or in a combination of hardware and software.

Every error event is not plausible in every time instance. For example, a +− error event represents a binary 01 pattern incorrectly detected as a 10 pattern. Thus, detector 200 only needs to consider a +− error if a 10 is detected. A +− error is said to be qualified by the presence of a detected 10 pattern.

For each error event (e.g., +−), there exists a complementary error event (e.g., −+). SISO detector 200 computations that correspond to an error event differ only in their sign from SISO detector 200 computations that correspond to the complementary error event.

An error event and its complementary event cannot both be qualified for the same data pattern. For this reason, a single qualifier can be used to check both an error event and its complement. The computation is preferably performed only once. If the complementary error event is the one that is qualified, the sign of the computed value is simply flipped. In the example of SISO post processor given in FIGS. 3A and 3B, it is understood that for every error event, the qualifier (i.e., 308A-308E) considers that error event as well as its complementary error event.

Often an error event affects adjacent bits. For example, a + error event can affect more than one bit, and a +− error event can affect more than two bits. According to some embodiments of the present invention, a SISO post processor considers the effect of an error event on an arbitrary number of positions to the left and to the right of the error event. For example, the effect that a + error event has on one bit to the left and one bit to the right of the error event can be analyzed by the SISO post processor. Analyzing the effect that a + error event has on one bit to the left and one bit to the right of the error event can emphasized using the notation 0+0 instead of +.

The number of bits that are analyzed to the left and to the right of an error event are independent of the error event and can be arbitrarily selected. For example, the SISO post processor can extend the + error event by analyzing the effect that the error event has two bits to the left and three bits to the right of the error event. This particular extension of the + error event is denoted as 00+000. Even before the error event started flipping bits and/or after the error event stopped flipping bits, the error event can still be considered active for some time.

An example of the present invention is now described in detail with respect to Table 1. This example is not intended to limit the scope of the present invention. The example shown in Table 1 merely illustrates some of the functions performed by Soft Input Soft Output (SISO) detector 200.

Eleven bits from a sequence of 20 consecutive zeros generated by Viterbi detector 203 are shown in the second row of Table 1. The bit shown in the second column of Table 1 is the $6^{th}$ bit in the 20 bit sequence, and the bit shown in the last column of Table 1 is the $16^{th}$ bit in the sequence. For simplicity, only three error filters corresponding to the following three error events +, +− and +0+ are analyzed in the example shown in Table 1. Each of the three error events starts at a different moment in time, but in this example, each error event affects the bits considered. For each error event and its particular position in time, the affected bit positions are underlined. The column for the current bit corresponding to time interval (0,1) is the $7^{th}$ column in Table 1 that has a 0 starting time.

TABLE 1

| | Starting time | | | | | | | | | | |
|---|---|---|---|---|---|---|---|---|---|---|---|
| | −5 | −4 | −3 | −2 | −1 | 0 | 1 | 2 | 3 | 4 | 5 |
| Viterbi sequence, Δ = 0 | 0 | 0 | 0 | 0 | 0 | 0 | 0 | 0 | 0 | 0 | 0 |
| 0+0 event starting at −2, Δ = +1.1 | 0 | 0 | 0 | <u>0</u> | <u>1</u> | <u>0</u> | 0 | 0 | 0 | 0 | 0 |
| 0+0 event starting at −1, Δ = +0.23 | 0 | 0 | 0 | 0 | <u>0</u> | <u>1</u> | <u>0</u> | 0 | 0 | 0 | 0 |
| 0+0 event starting at 0, Δ = +1.4 | 0 | 0 | 0 | 0 | 0 | <u>0</u> | <u>1</u> | <u>0</u> | 0 | 0 | 0 |
| +− event starting at −1, Δ = +9999 | | | | | | N/A | | | | | |
| +− event starting at 0, Δ = +9999 | | | | | | N/A | | | | | |
| +0+ event | 0 | 0 | 0 | <u>1</u> | <u>0</u> | <u>1</u> | 0 | 0 | 0 | 0 | 0 |

TABLE 1-continued

| | Starting time | | | | | | | | | | |
|---|---|---|---|---|---|---|---|---|---|---|---|
| | −5 | −4 | −3 | −2 | −1 | 0 | 1 | 2 | 3 | 4 | 5 |
| starting at −2, Δ = −0.17 +0+ event | 0 | 0 | 0 | 0 | <u>1</u> | <u>0</u> | <u>1</u> | 0 | 0 | 0 | 0 |
| starting at −1, Δ = −0.41 +0+ event | 0 | 0 | 0 | 0 | 0 | <u>1</u> | <u>0</u> | <u>1</u> | 0 | 0 | 0 |
| starting at 0, Δ = +0.15 | | | | | | | | | | | |

Error event +− and its complement cannot have occurred for the particular Viterbi detected sequence that has 20 consecutive zeros. The event +− and its complement −+ can only be applied to a sequence '10' (resulting in '01') or to a sequence '01' (resulting in '10'). Because there are no sequences of type '10' or '01' in the example Viterbi detected sequence having 20 consecutive zeros, event +− is not qualified. In this example, the value assigned to a difference metric of an unqualified error event is chosen to be +9999.

The generation of the soft information is now described for the 11$^{th}$ bit in the 20 bit sequence (shown in the 7$^{th}$ column of Table 1 at starting time 0). The 11$^{th}$ bit corresponds to the time interval (0,1) detected in the Viterbi detector as a zero. In order to generate soft information, SISO detector 200 can compare the sequence detected by Viterbi detector 203 with alternative sequences that are obtained by applying every error event in every time instance.

The Viterbi sequence and an alternative sequence are compared using a metric. Every bit sequence is given a metric M, which represents the distance between the ideal response (or ideal signal) corresponding to the bit sequence and the received signal. The closer the two signals are, the smaller the metric, and the better the estimate of the bits. In general, metrics are positive, because a metric represents a distance.

Every error filter in every time instance computes a difference metric Δ. The difference metric Δ can be calculated using equation (2) below, where M is a metric of the sequence obtained by applying an error event to the Viterbi sequence in one particular time instant, and $M_{VITERBI}$ is the metric of the Viterbi sequence.

$$\Delta = M - M_{VITERBI} \quad (2)$$

Because the Viterbi sequence is the best in most cases (i.e., its metric is the smallest), the computed difference metric Δ is usually positive. The values of the difference metrics Δ that correspond to the considered sequences are also shown in Table 1.

As discussed above, the soft information of a bit b is commonly represented by a log-likelihood ratio (LLR). Information contained in the LLR includes the LLR magnitude and the LLR sign. The LLR magnitude indicates how reliable a bit estimate is. The larger the LLR magnitude, the more reliable the bit estimate is. The LLR sign indicates the bit value. An LLR less than zero (LLR<0) indicates a 0 bit value. An LLR greater than 0 (LLR>0) indicates a 1 bit value.

In SISO post processor 300, the soft information (or the log-likelihood ratio) can be computed using equation (3), where b is the bit value (0 or 1) as determined by Viterbi detector 203, $\Delta_{MIN}(b)$ is the minimum value of the difference metric Δ when the bit considered is not flipped, and $\Delta_{MIN}(b^C)$ is the minimum value of the difference metric Δ when the bit considered is flipped.

$$LLR = (-1)^b (\Delta_{MIN}(b) - \Delta_{MIN}(b^C)) \quad (3)$$

In equation (3), $\Delta_{MIN}(b)$ corresponds to the most likely error event that does not flip the considered bit, and $\Delta_{MIN}(b^C)$ corresponds to the most likely error event that flips the considered bit. Using the example difference metrics Δ shown in Table 1 where b=0, $\Delta_{MIN}(b^C)$=min{+0.23, −0.17, +0.15}=−0.17, $\Delta_{MIN}(b)$=min{0, +1.1, +1.4, −0.41}=−0.41, and LLR= $(-1)^0 \times (-0.41 - (-0.17))$=−0.24. Because the calculated LLR is less than 0, the bit value remains 0. Note that when b takes values +1 (corresponding to binary 1) and −1 (corresponding to binary 0), then LLR=b·($\Delta_{MIN}(b^C) - \Delta_{MIN}(b)$).

However, if the SISO post processor only analyzes error events that flip the considered bit, then LLR=$-(-1)^b \Delta_{MIN}(b^C)$. Hence, the LLR=$-(-1)^0 (-0.17)$=0.17. The computed bit value is 1, because the calculated LLR is greater than 0. Thus, an incorrect result can be generated if error events that do not flip the current bit are not analyzed.

Events having negative difference metric Δ values can be encountered in the post processor when the received signal used in the post processor is more accurate than the signal used in the Viterbi detector. Capturing and analyzing soft information for error events that do not flip the current bit is particularly useful for correcting error events having negative Δ values.

Note that Δ can also be defined as $\Delta = M_{VITERBI} - M$. This definition implies that Δ values will mostly be negative and that positive Δ values will be rare. More likely error events will have larger instead of smaller Δ values, and the LLR is computed as:

$$LLR = b \cdot (\Delta_{MAX}(b) - \Delta_{MAX}(b^C))$$

The LLR computation in SISO post processor 300 can also be represented as shown in equation (4) below. In equation (4), $M_{MIN}(0)$ represents the metric of the most likely alternative sequence obtained by the applying a single error event (including a null event) in which the considered bit b is zero, and $M_{MIN}(1)$ represents the metric of the most likely alternative sequence obtained by the applying a single error event (including a null event) in which the considered bit b is one.

$$LLR(b) = \Delta_{MIN}(0) - \Delta_{MIN}(1) = M_{MIN}(0) - M_{MIN}(1) \quad (4)$$

The approximation shown in equation (5) below is also valid for the LLR computation in SISO post processor 300. In equation (5), $\mu_{MIN}(0)$ represents the metric of the most likely alternative sequence obtained by the applying any combination of non-overlapping single error events in which the considered bit b is zero, and $\mu_{MIN}(1)$ represents the metric of the most likely alternative sequence obtained by the applying any combination of non-overlapping single error events in which the considered bit b is one.

$$LLR(b) \approx \mu_{MIN}(0) - \mu_{MIN}(1) \quad (5)$$

Techniques of the present invention can be implemented in error detection and correction decoders that are used in data storage devices such as magnetic hard disk drives and optical disk drives, and semiconductor memory systems such as RAM and non-volatile memories. Techniques of the present invention can also be implemented in error detection and correction decoders used in data transmission systems that transmit and receive data over communication links.

The foregoing description of the exemplary embodiments of the present invention has been presented for the purposes of illustration and description and are not intended to be exhaustive or to limit the scope of the present invention to the examples disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is not intended that the scope of the present invention be limited with this detailed description.

The invention claimed is:

1. A system for generating bit reliabilities, the system comprising:
   a detector that generates a detected sequence; and
   a post processor that generates values indicating probabilities of a plurality of error events in the detected sequence, that partitions the values into first and second subsets, that selects a first most likely value from the first subset of the values, that selects a second most likely value from the second subset of the values, and that generates a bit reliability based on the first and the second most likely values.

2. The system defined in claim 1 wherein the first subset of the values corresponds to error events that flip a current bit, and the second subset of the values corresponds to error events that do not flip the current bit.

3. The system defined in claim 1 wherein the first subset of the values corresponds to error events yielding a value of one for a current bit, and the second subset of the values corresponds to error events yielding a value of zero for the current bit.

4. The system defined in claim 1 wherein bits in the detected sequence that flip to form an error event are on neighboring rows, neighboring columns, or neighboring rows and neighboring columns of a two dimensional storage system.

5. The system defined in claim 1 wherein the post processor comprises:
   latches that store the values indicating the probabilities of the plurality of error events at different bit locations.

6. The system defined in claim 1 wherein the post processor comprises:
   an adder that receives the first most likely value and the second most likely value; and
   a multiplier that multiplies an output of the adder by a bit from the detected sequence, the bit having a value of +1 for a binary 1 and −1 for a binary 0.

7. The system defined in claim 1 wherein the detector is a Viterbi detector.

8. The system defined in claim 1 wherein the post processor is a soft-input-soft-output post processor.

9. The system defined in claim 8 wherein the soft-input-soft-output post processor comprises:
   error event filters that store multi-bit error events; and
   qualifiers that determine if each of the multi-bit error events is possible based on the detected sequence.

10. The system defined in claim 9 wherein the soft-input-soft-output post processor further comprises:
    adders that add or subtract outputs of the qualifiers to error event energy terms.

11. A method for generating bit reliabilities using a post processor in response to a detected sequence from a detector, the method comprising:
    generating values that each indicate a probability of an error event in the detected sequence;
    partitioning the values into first and second subsets;
    selecting a first most likely value from the first subset of the values;
    selecting a second most likely value from the second subset of the values; and
    generating a bit reliability based on the first and the second most likely values.

12. The method defined in claim 11 wherein the first subset of the values corresponds to error events that flip a current bit, and the second subset of the values corresponds to error events that do not flip the current bit.

13. The method defined in claim 11 wherein the first subset of the values corresponds to error events yielding a value of one for a current bit, and the second subset of the values corresponds to error events yielding a value of zero for the current bit.

14. The method defined in claim 11 wherein the post processor is a soft-input-soft-output post processor.

15. The method defined in claim 11 wherein generating the values that each indicate the probability of an error event in the detected sequence comprises:
    combining modified matched filtered noise values for bits affected by error events at event filters;
    determining if each of the error events is possible based on the detected sequence using qualifiers; and
    calculating difference metric values that each indicate a probability of an error event in the detected sequence using outputs of the qualifiers and error event energy terms.

16. The method defined in claim 11 wherein generating the bit reliability based on the first and the second most likely values further comprises:
    computing a log likelihood ratio to represent the bit reliability using the first most likely value, the second most likely value, and a bit from the detected sequence, the bit having a value of +1 for a binary 1 and −1 for a binary 0.

17. A data storage device that generates bit reliabilities, the data storage device comprising:
    a detector that generates a detected sequence; and
    a soft-input-soft-output post processor that generates values indicating likelihoods of a plurality of error events in the detected sequence, that partitions the values into first and second subsets, that selects a first most likely value among the first subset of the values, that selects a second most likely value among the second subset of the values, and that generates a bit reliability based on the first and the second most likely values.

18. The data storage device defined in claim 17 wherein the first subset of the values corresponds to error events that flip a current bit, and the second subset of the values corresponds to error events that do not flip the current bit.

19. The data storage device defined in claim 17 wherein the first subset of the values corresponds to error events yielding a value of one for a current bit, and the second subset of the values corresponds to error events yielding a value of zero for the current bit.

20. The data storage device defined in claim 17 wherein the soft-input-soft-output post processor comprises:
    error event filters that store multi-bit error events;
    qualifiers that determine if each of the multi-bit error events is possible based on the detected sequence; and
    computation blocks that compute the values using outputs of the qualifiers and error event energy terms.

* * * * *